US012775042B2

(12) United States Patent
Sherman

(10) Patent No.: US 12,775,042 B2
(45) Date of Patent: Oct. 27, 2026

(54) MAGNETICALLY RETAINED REPLACEABLE CHUCK ASSEMBLY FOR PICK-AND-HOLD TEST HEAD UNIT

(71) Applicant: ADVANTEST CORPORATION, Tokyo (JP)

(72) Inventor: Patrick Sherman, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 109 days.

(21) Appl. No.: 18/379,073

(22) Filed: Oct. 11, 2023

(65) Prior Publication Data

US 2024/0133948 A1 Apr. 25, 2024
US 2024/0230753 A9 Jul. 11, 2024

Related U.S. Application Data

(60) Provisional application No. 63/417,478, filed on Oct. 19, 2022.

(51) Int. Cl.
*G01R 31/28* (2006.01)
*B65G 47/90* (2006.01)

(52) U.S. Cl.
CPC ......... *G01R 31/2887* (2013.01); *B65G 47/90* (2013.01)

(58) Field of Classification Search
None
See application file for complete search history.

(56) References Cited

U.S. PATENT DOCUMENTS 5,150,042 A * 9/1992 Look .................... G01R 31/315 324/226
6,099,597 A * 8/2000 Yap ...................... G01R 1/0408 438/18
6,919,734 B2 * 7/2005 Saito ...................... G01R 31/01 324/750.09

(Continued)

FOREIGN PATENT DOCUMENTS

KR 10-0580816 B1 5/2006
KR 10-2007-0032323 A 3/2007

(Continued)

OTHER PUBLICATIONS

Office Action received for Korean Application No. 10-2024-7040753 dated Aug. 30, 2025, 22 pages (10 pages of English Translation and 12 pages of official copy).

*Primary Examiner* — Richard Isla
(74) *Attorney, Agent, or Firm* — Squire Patton Boggs LLP; Sarah Mirza

(57) ABSTRACT

Embodiments of the present invention provide a contact chuck test head for a handler of an integrated circuit tester system. The contact chuck test head comprises a magnetically held DUT contact unit that can be replaced by a technician without requiring any tool or special equipment. The contact chuck test head t is mounted to an automated handler. Magnets are employed at an interface between the DUT contact unit and contact chuck base. This allows the DUT contact unit to be brought into close proximity to the contact chuck base portion and magnetic forces act to both align and mate the two parts together. Since the DUT contact unit requires change out to accommodate different sizes and types of DUTs, it is advantageous to provide an easy swap-out mechanism.

19 Claims, 11 Drawing Sheets

(56) References Cited

U.S. PATENT DOCUMENTS

| | | | | |
|---|---|---|---|---|
| 10,962,590 | B2 * | 3/2021 | Yam | G11C 11/16 |
| 2003/0237061 | A1 * | 12/2003 | Miller | G11C 29/56 438/18 |
| 2007/0200555 | A1 | 8/2007 | Mizushima et al. | |
| 2009/0153167 | A1 | 6/2009 | Stewart et al. | |
| 2011/0254945 | A1 * | 10/2011 | Kikuchi | G01R 31/2893 324/750.16 |
| 2014/0020863 | A1 * | 1/2014 | Hawwa | H01L 23/40 165/67 |
| 2015/0276860 | A1 * | 10/2015 | Aizawa | G01R 31/2887 324/750.25 |
| 2016/0109512 | A1 | 4/2016 | Kim et al. | |
| 2019/0302178 | A1 | 10/2019 | Saito | |
| 2021/0194601 | A1 | 6/2021 | Shiota et al. | |

FOREIGN PATENT DOCUMENTS

| | | | | |
|---|---|---|---|---|
| KR | 20-2009-0002792 | U | 3/2009 | |
| KR | 10-2009-0076299 | A | 7/2009 | |
| KR | 1020140128517 | | 11/2014 | |
| KR | 101556143 | B1 * | 10/2015 | G01R 31/31718 |
| KR | 10-1588809 | B1 | 1/2016 | |
| KR | 102192764 | B1 * | 12/2020 | G01R 31/2886 |

* cited by examiner

MAGNETICALLY RETAINED REPLACEABLE CHUCK ASSEMBLY FOR PICK-AND-HOLD TEST HEAD UNIT

RELATED APPLICATIONS

This application claims benefit of, and priority to U.S. Provisional Application Ser. No. 63/417,478 filed Oct. 19, 2022 to Sherman, which is hereby incorporated herein by reference in its entirety.

FIELD OF INVENTION

Embodiments of the present invention relate to the field of integrated circuit manufacturing and testing. More specifically, embodiments of the present invention relate to systems and methods for testing integrated circuit products utilizing automated robotic transport and handling mechanisms including pick-and-place and/or pick-and-hold machines and/or robots.

BACKGROUND

It is common to subject integrated circuits, either packaged or unpackaged, to environmental and electronic testing as an operation in a manufacturing processes. Typically in such testing, the integrated circuit devices are subject to electrical testing, e.g., "test patterns," to confirm functionality while contemporaneously being subjected to environmental stress. For example, an integrated circuit is heated and/or cooled to its specification limits while being electrically tested. In some cases, e.g., for qualification testing, an integrated circuit may be stressed beyond its specifications, for example, to determine failure points and/or establish "guard band" on its environmental specifications.

Traditionally, such testing has included placing one or more integrated circuits and their associated test interface(s) and support hardware into an environmental chamber or other tester. The environmental chamber would heat and/or cool the integrated circuit(s) under test, known as or referred to as a device under test, or "DUT," as well as subject the test interface and support hardware, to the desired test temperature.

Some testing systems employ automated robot handlers to move the integrated circuits from a source "tray" or "plate" to the tester and test environment. Some devices and/or tests require positive pressure or force to be applied to a DUT during testing. For example, some package types, e.g., ball grid arrays (BGA), may not make reliable contact without a force applied to ensure contact between the balls and contacts of a test apparatus. At other times, a heater and/or heat sink may be held against a DUT during testing. For such testing, it is common to utilize a "contact chuck." A contact chuck may also be known as a "pick and place chuck," a "handler chuck," a "device chuck," and/or a "pick and hold chuck." A "contact chuck" or a "pick and hold chuck" is utilized to move a DUT from a source "tray" or "plate" to the tester and test environment, and to hold the DUT in place during testing.

FIG. 1 shows a conventional pick and hold assembly or contact chuck assembly 10. Assembly 10 comprises two fasteners, e.g., bolts, 11 to secure the assembly 10 to a handler (not shown) for movement in the X, Y, and Z dimensions. The assembly 10 is typically oriented downward. For example, a DUT (not shown) would be located within DUT interface 15.

The DUT interface 15 is typically very specific to a particular DUT. Accordingly, the assembly 10 is typically changed for each type of DUT to be tested. For a test setup configured to test 16 DUTs, 32 fasteners 11 are utilized. Thus, a change-over from a test system for a first DUT to test a second DUT requires removal of 32 fasteners 11, and insertions of 32 fasteners 11.

SUMMARY OF THE INVENTION

Accordingly, embodiments of the present invention provide a contact chuck test head for a handler of an integrated circuit tester system. The contact chuck test head comprises a magnetically held DUT contact unit that can be replaced by a technician without requiring any tool or special equipment. The contact chuck test head t is mounted to an automated handler. Magnets are employed at an interface between the DUT contact unit and contact chuck base. This allows the DUT contact unit to be brought into close proximity to the contact chuck base portion and magnetic forces act to both align and mate the two parts together. Since the DUT contact unit requires change out to accommodate different sizes and types of DUTs, it is advantageous to provide an easy swap-out mechanism.

In accordance with a first embodiment of the present invention, a contact chuck test head assembly includes a device under test (DUT) interface unit configured to physically mate with a DUT and a contact chuck base unit configured to magnetically retain the DUT interface unit. The contact chuck base unit is configured to be magnetically retained by a handler device, wherein the handler device is configured to move DUTs within a test environment. The contact chuck test head assembly is configured to apply a force to the DUT in a test fixture during testing of the DUT.

Embodiments include the above and further include wherein the contact chuck test head assembly is magnetically attached to a DUT layout unit.

Embodiments include the above and further include wherein the contact chuck test head assembly is magnetically attached to a DUT layout unit heat sink unit.

Embodiments include the above and further include a hardstop plate configured to limit downward travel of the contact chuck test head assembly.

Embodiments include the above and further include an alignment projection to align the contact chuck test head assembly with a test fixture.

Embodiments include the above and further include a pneumatic cylinder configured to retain the DUT during movement of the contact chuck test head assembly.

Embodiments include the above and further include wherein the contact chuck test head assembly is further configured to conduct heat energy away from the DUT during testing.

Embodiments include the above and further include alignment holes to accept protrusions from a DUT layout unit to align the contact chuck test head assembly with the DUT layout unit.

Embodiments include the above and further include fastening holes configured for coupling to a non-magnetic DUT layout unit.

Embodiments include the above and further include a channel to apply a vacuum configured to retain the DUT.

Embodiments include the above and further include wherein the channel is further configured to apply a gas pressure to eject the DUT.

In accordance with another embodiment of the present invention, a magnetic device under test layout unit (DLU)

includes a DLU heatsink and a contact chuck interface, where in the DLU is configured to retain a contact chuck via magnetic force.

Embodiments include the above and further include a plurality of magnets for coupling to the contact chuck.

Embodiments include the above and further include wherein the magnets comprise samarium cobalt.

Embodiments include the above and further include wherein the DLU comprises magnetic material attracted to magnets of the contact chuck.

Embodiments include the above and further include wherein the contact chuck interface comprises projections configured to align with holes of the contact chuck.

Embodiments include the above and further include wherein the contact chuck interface is configured to couple thermal energy from the DUT to the DLU heatsink.

In accordance with a method embodiment of the present invention, a method of testing an integrated circuit device under test (DUT) includes magnetically coupling a contact chuck to a device under test layout unit (DLU), picking a DUT using the contact chuck while coupled to the DLU, placing the DUT into a test fixture, and testing the DUT while it is retained by the contact chuck.

Embodiments include the above and further include wherein the picking further comprises applying a vacuum to the DUT through the contact chuck.

In accordance with another method embodiment of the present invention, a method of changing a contact chuck includes removing a first magnetically retained contact chuck from a device under test layout unit (DLU) without using tools and magnetically coupling a second contact chuck to the DLU without using tools.

In accordance with a further embodiment of the present invention, a pick and place system includes a device under test layout unit (DLU), a first contact chuck configured to be removed from said DLU by manual force and without using tools, and a second contact chuck configured to be attached to said DLU without using tools.

Figure 1:
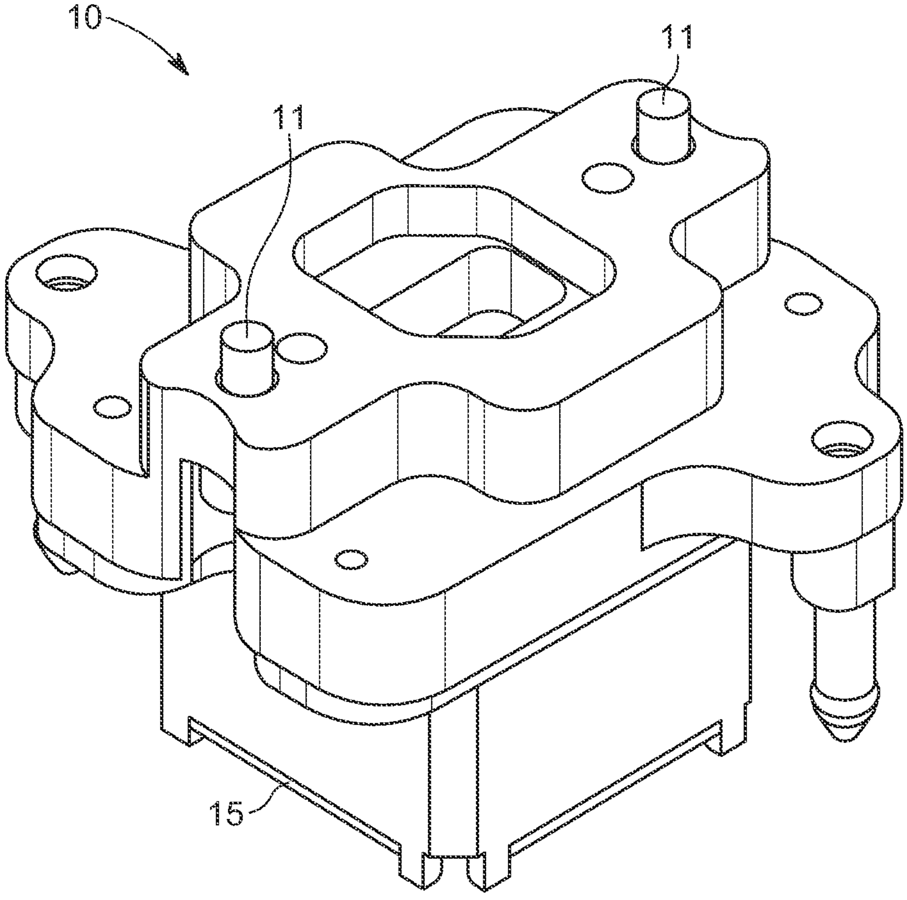
FIG. 1 shows a conventional pick and hold assembly or contact chuck assembly.

The accompanying drawings, which are incorporated in and form a part of this specification, illustrate embodiments of the invention and, together with the description, serve to explain the principles of the invention. Unless otherwise noted, dimensions are exemplary and the drawings may not be drawn to scale.

DETAILED DESCRIPTION

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions which follow are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "testing" or "heating" or "maintaining temperature" or "bringing" or "capturing" or "storing" or "reading" or "analyzing" or "generating" or "resolving" or "accepting" or "selecting" or "determining" or "displaying" or "presenting" or "computing" or "sending" or "receiving"

or "reducing" or "detecting" or "setting" or "accessing" or "placing" or "testing" or "forming" or "mounting" or "removing" or "ceasing" or "stopping" or "coating" or "processing" or "performing" or "generating" or "adjusting" or "creating" or "executing" or "continuing" or "indexing" or "translating" or "calculating" or "measuring" or "gathering" or "running" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The meaning of "non-transitory computer-readable medium" should be construed to exclude only those types of transitory computer-readable media which were found to fall outside the scope of patentable subject matter under 35 U.S.C. § 101 in In re Nuijten, 500 F.3d 1346, 1356-57 (Fed. Cir. 2007). The use of this term is to be understood to remove only propagating transitory signals per se from the claim scope and does not relinquish rights to all standard computer-readable media that are not only propagating transitory signals per se.

Figure 2:
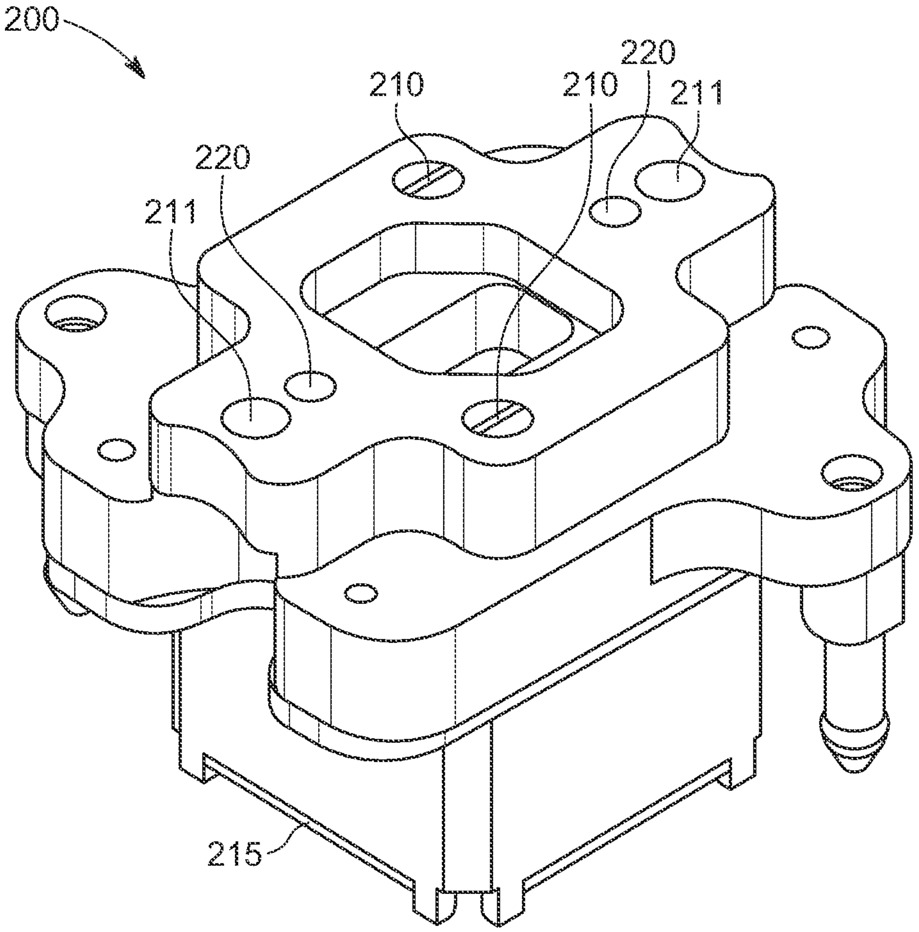
FIG. 2 illustrates an exemplary embodiment of the pick-and-hold contact chuck assembly in accordance with embodiments of the present invention.

Magnetically Retained Replaceable Chuck Assembly for Pick-and-Hold Test Head Unit FIG. 2 illustrates an exemplary embodiment of the pick-and-hold contact chuck assembly 200 in accordance with embodiments of the present invention. The pick-and-hold contact chuck assembly 200 is configured to pick a device under test ("DUT") from a source tray or plate, move the DUT to a test fixture or socket, place the DUT onto the fixture and/or into a socket, and hold and/or retain the DUT in place during a test. Typically, a robotic handler moves the test head in X, Y, and Z directions to place the test head 200 over a device under test ("DUT"). A plurality of magnets 210 installed on contact chuck assembly 200 replace the function of fasteners 11 (FIG. 1) to attach the contact chuck assembly 200 to a handler (not shown). For example, a DUT (not shown) would be located within DUT interface 215, obscured in this view.

The number of magnets 210 illustrated is exemplary. Note that the magnets 210 may not be located in the same position(s) as the fasteners 11. Rather, in some embodiments, the magnets 210 are located in different positions on the contact chuck assembly 200 from the fasteners 11. The holes 211 correspond to fasteners 11 of assembly 10 and are present to ensure reverse compatibility with assembly 10 (FIG. 1). The contact chuck assembly 200 also includes a plurality of alignment holes 220 to accept dowels and/or pins to align with a handler assembly.

In accordance with embodiments of the present invention, the magnets 210 may align with corresponding magnets (opposite poles) of a handler assembly (not shown). In some embodiments, the handler assembly may not include such magnets. For example, the handler assembly may be formed from magnetic materials which are attracted by the magnets 210.

Figure 3A:
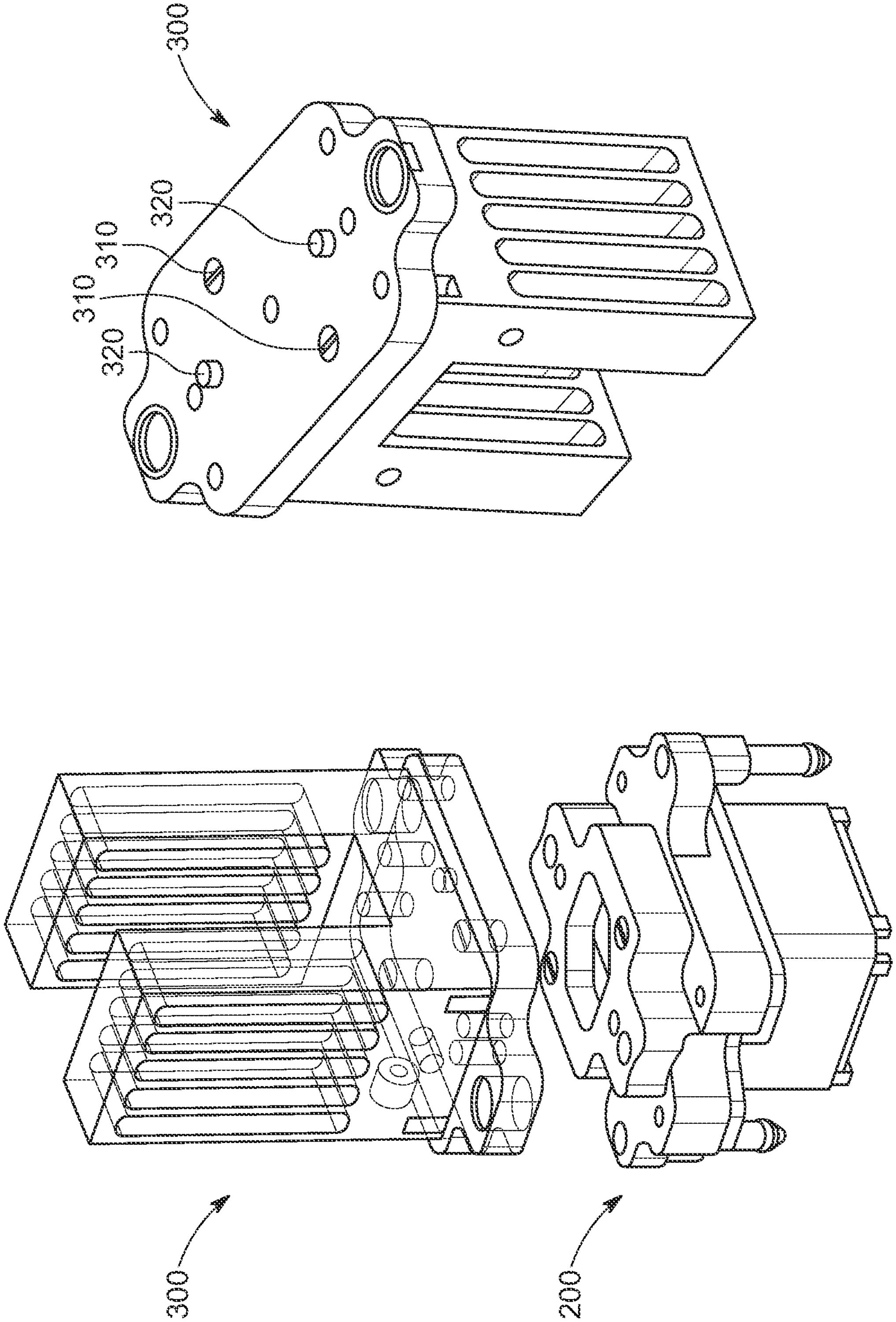
FIG. 3A illustrates a magnetic DUT Layout Unit ("DLU") heat sink, in accordance with embodiments of the present invention.

FIG. 3A illustrates a magnetic DUT Layout Unit ("DLU") heat sink 300, in accordance with embodiments of the present invention. A DLU may also be known as or referred to as a chuck fixture, chuck mounting plate, and/or a chuck attachment plate. DLU heatsink 300 is configured to attach magnetically to magnetic contact chuck assembly 200. DLU heatsink 300 comprises a plurality of magnets 310 configured to align with mangers 210 of the contact chuck assembly 200 (FIG. 2). The number and location of the plurality of magnets 310 is exemplary. DLU heatsink 300 also comprises a plurality of alignment holes 320 to accept dowels and/or pins to align with magnetic contact chuck assembly 200. In some embodiments, DLU heatsink 300 may comprise dowels and/or pins to align with the holes 220 (FIG. 2) of magnetic contact chuck assembly 200.

Figure 3B:
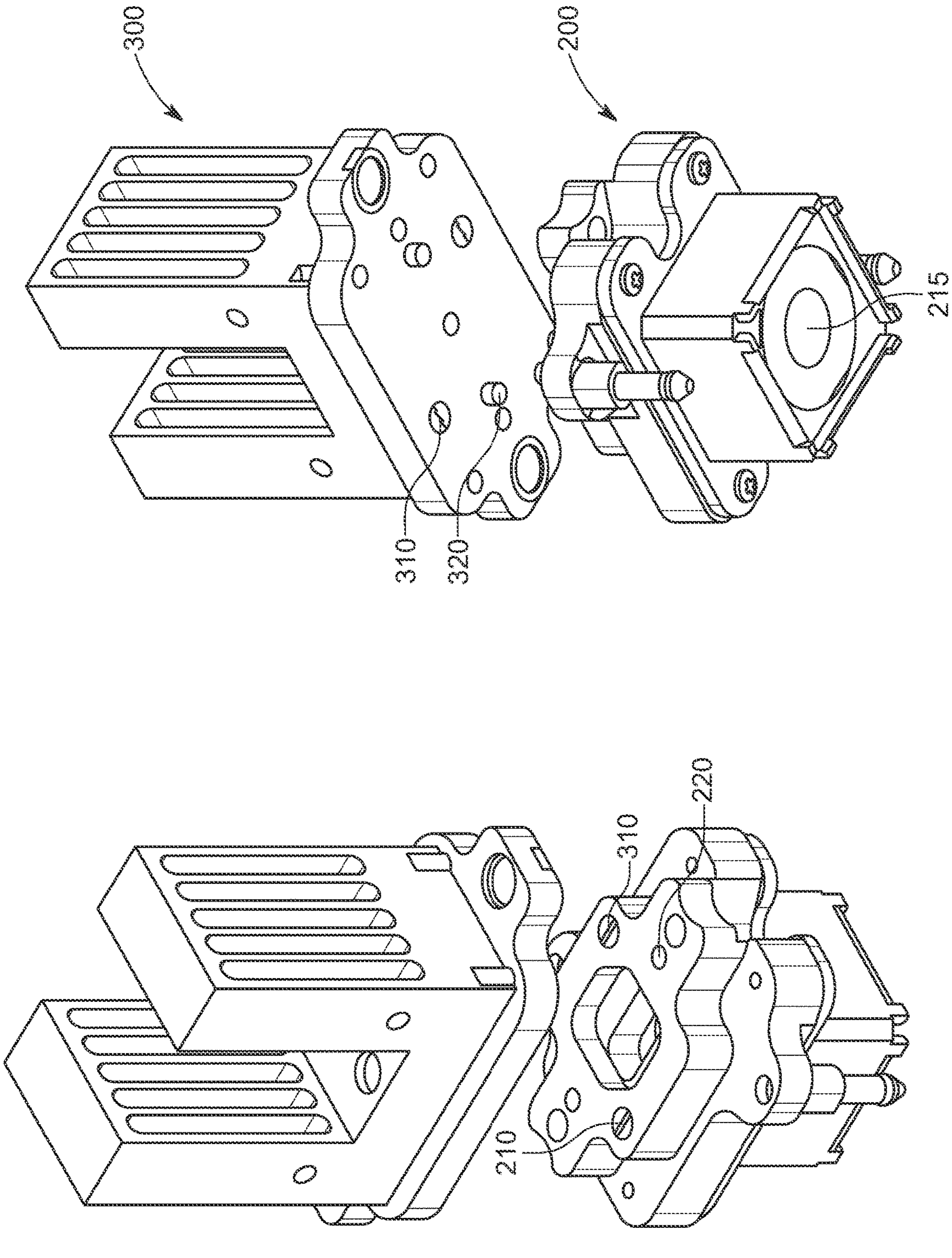
FIG. 3B illustrates a magnetic DLU heatsink in conjunction with a magnetic contact chuck assembly, in accordance with embodiments of the present invention.

FIG. 3B illustrates a magnetic DLU heatsink 300 in conjunction with a magnetic contact chuck assembly 200, in accordance with embodiments of the present invention. FIG. 3B illustrates alignment of a DLU heatsink 300 with a magnetic contact chuck assembly 200. FIG. 3B also illustrates DUT interface 215. In some embodiments, contact chuck assembly 200 may retain a DUT via vacuum action.

Figure 4:
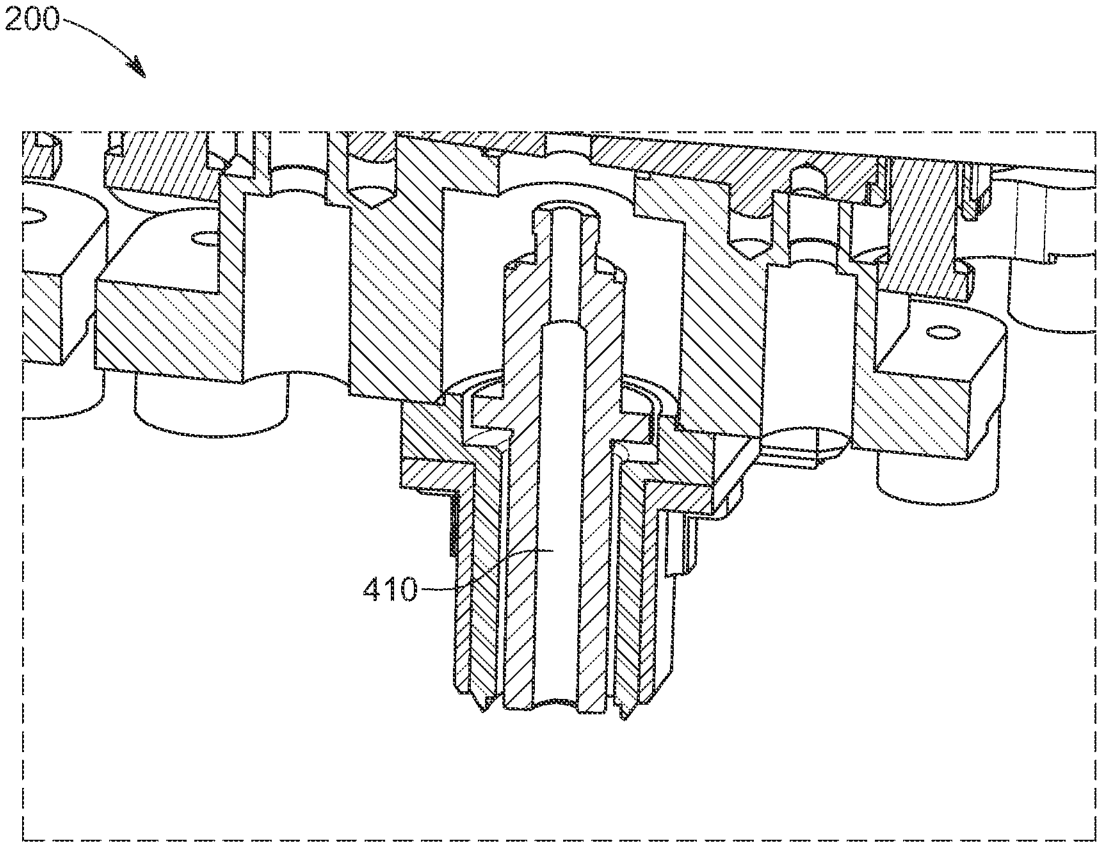
FIG. 4 illustrates a sectional view of contact chuck assembly, in accordance with embodiments of the present invention.

FIG. 4 illustrates a sectional view of contact chuck assembly 200, in accordance with embodiments of the present invention. Contact chuck assembly 200 comprises a pneumatic tube or cylinder 410. The cylinder 410 is configured to draw a vacuum against a device under test in order to pick up a device under test, e.g., from a source tray or plate, and place the device under test into a test fixture. The cylinder 410 is also configured to remove a device under test from a test fixture and place the device under test into a post-test tray or plate.

Figure 5:
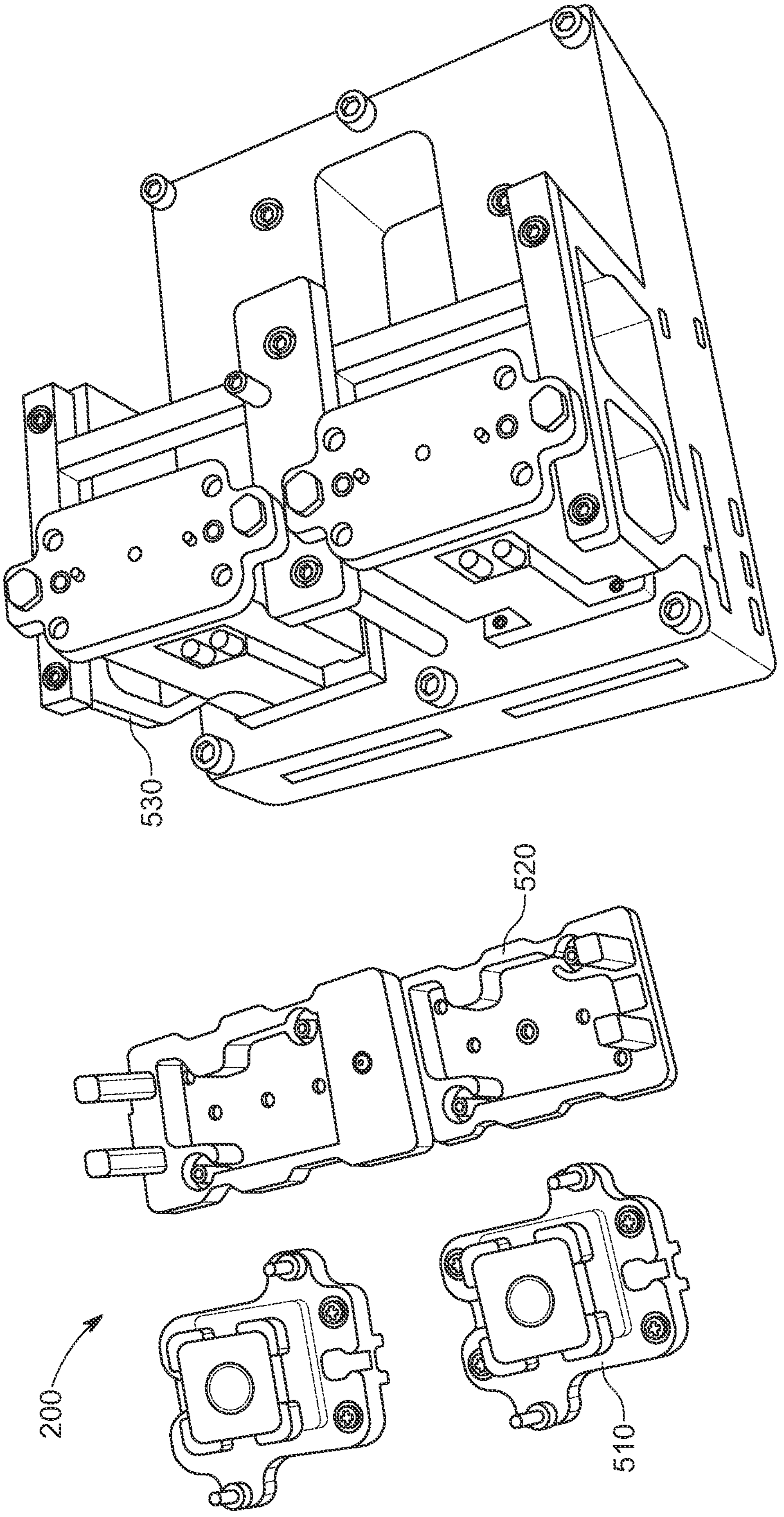
FIG. 5 illustrates contact chuck assembly and a DUT Layout Unit, in accordance with embodiments of the present invention.

FIG. 5 illustrates contact chuck assembly 200 and a DUT Layout Unit ("DLU") 530, in accordance with embodiments of the present invention. Contact chuck assembly 200 comprises a DUT contact unit 510 and a contact chuck base unit 520. DUT contact unit 510 fits into contact chuck base unit 520, and is magnetically retained thereto, to form contact chuck assembly 200. The contact chuck assembly 200 is configured to attach, and be magnetically retained, to DUT Layout Unit 530. In the illustrated embodiment, DUT Layout Unit 530 does not comprise prominent heat sink elements, e.g., "fins." It is appreciated, however, that DUT Layout Unit 530 may still comprise a heat sink function.

Figure 6:
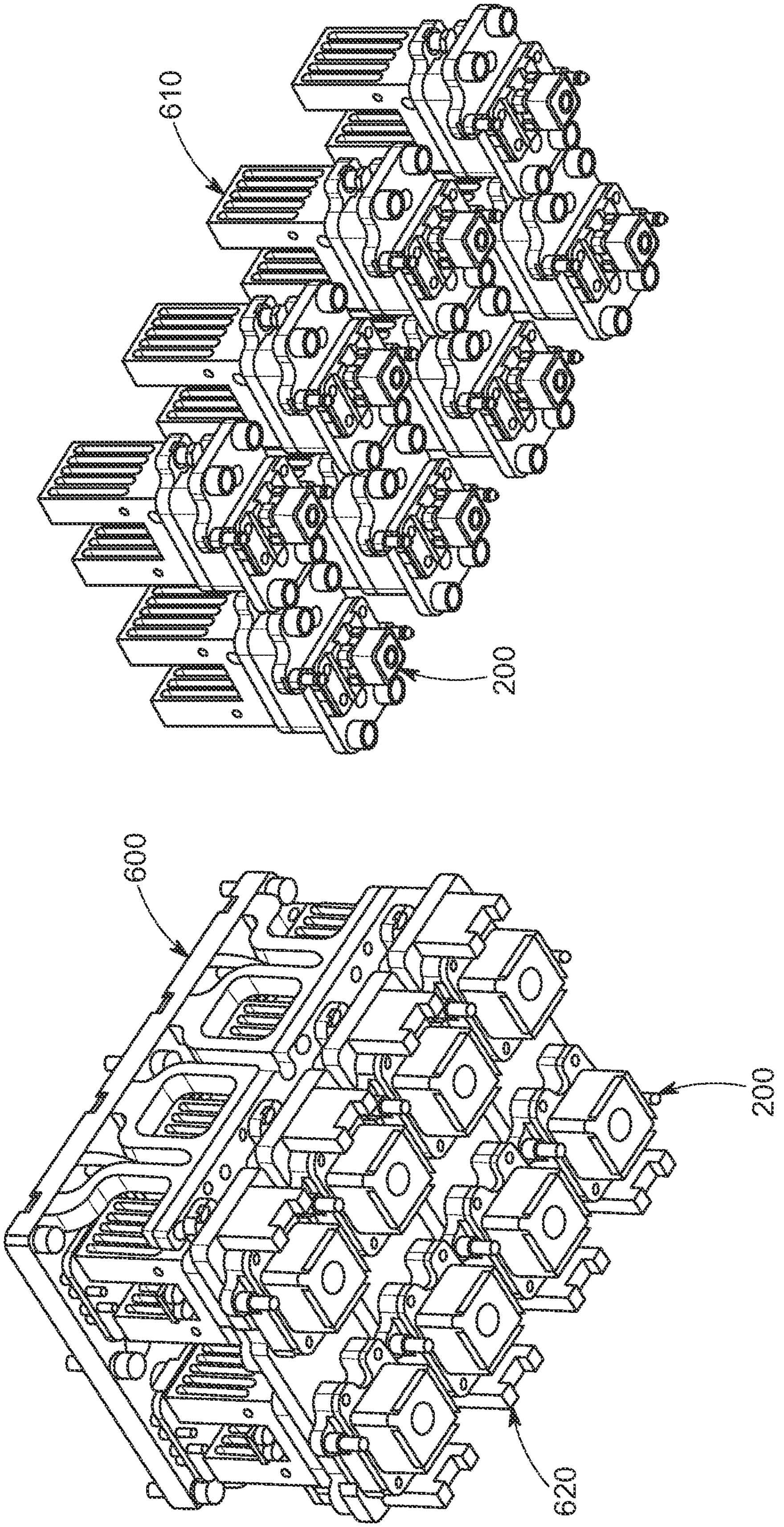
FIG. 6 illustrates an assembly view of magnetically retained contact chucks, in accordance with embodiments of the present invention.

FIG. 6 illustrates an assembly view of magnetically retained contact chucks, in accordance with embodiments of the present invention. A plurality of magnetically retained contact chucks 200 are attached, and magnetically retained to a DUT layout unit 600 or to a magnetically retained DLU heat sink unit 610. The DUT interface of the contact chucks 200 may be different based on the package type of the DUT, e.g., a ball-grid array (BGA) DUT may generally require a different contact chuck 200 than is required for a Leaded Ceramic Chip Carrier (LCCC) package. In some embodiments, a hardstop plate 620 is configured to limit downward travel of the contact chuck assembly 200, e.g., to prevent a DUT from being forced too far into a test fixture.

Figure 7A:
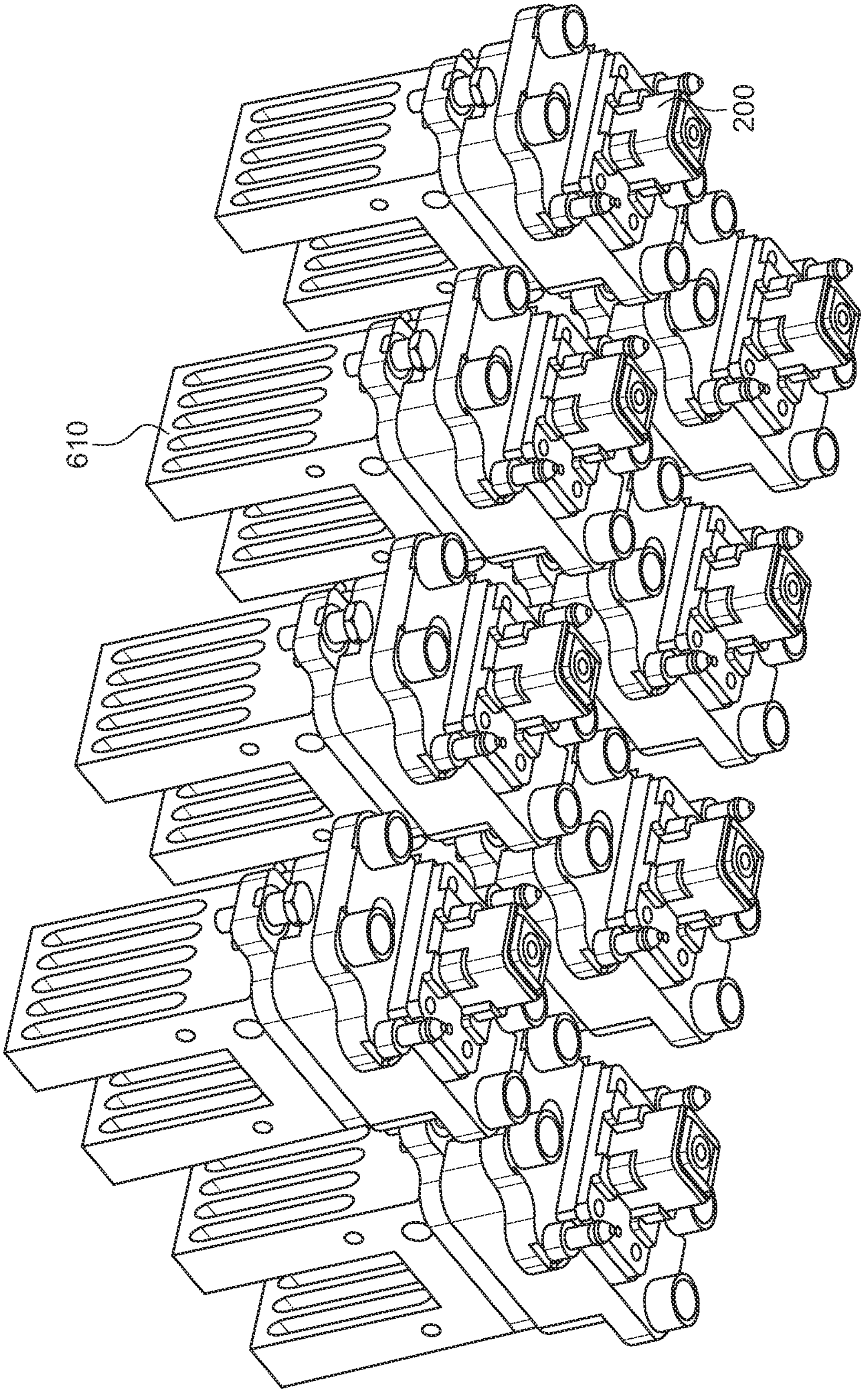
FIG. 7A illustrates a plurality of contact chuck assemblies magnetically attached to a plurality of DLU heat sink units, in accordance with embodiments of the present invention.
Figure 7B:
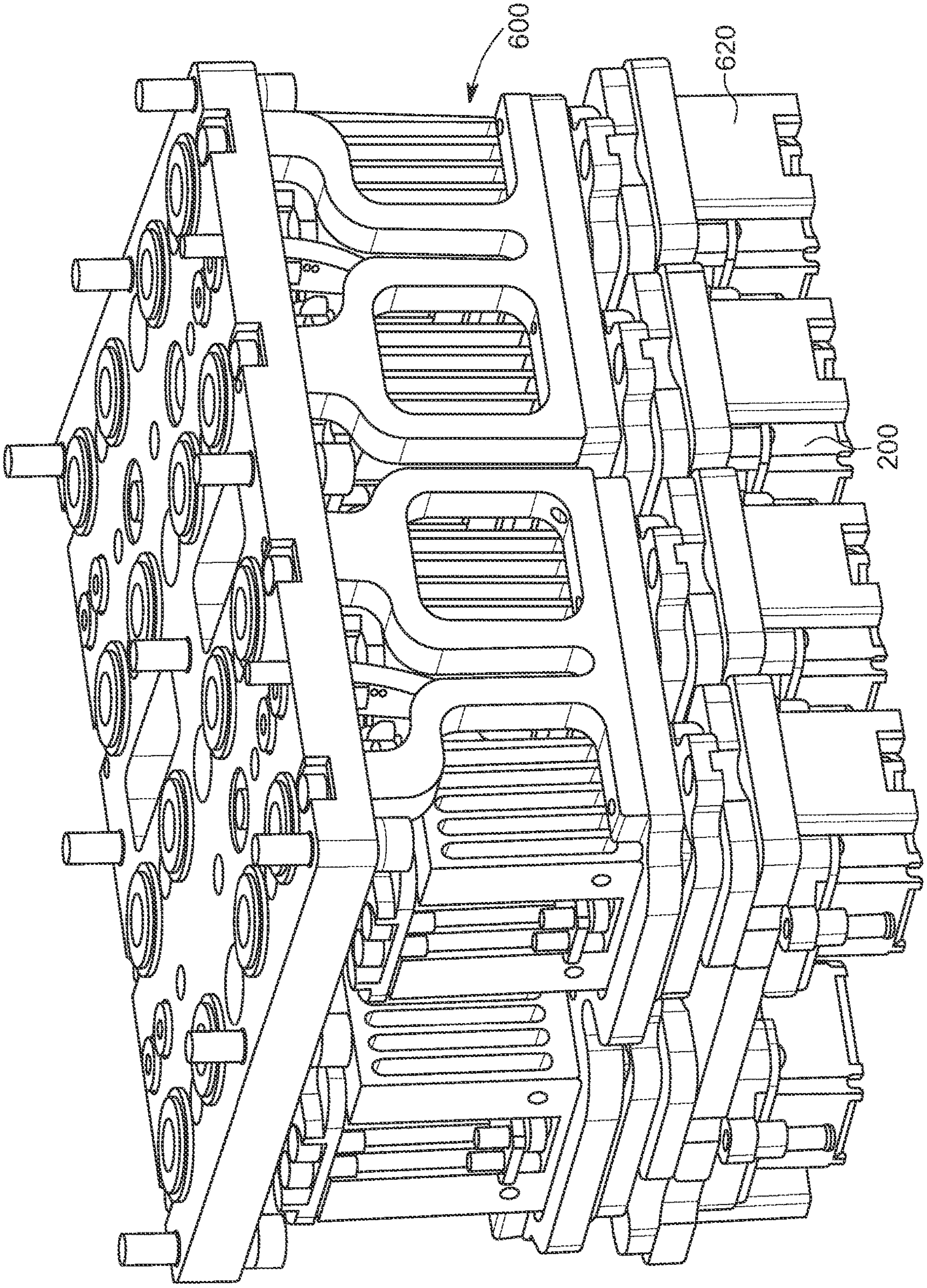
FIG. 7B illustrates a top isometric view of a plurality of contact chuck assemblies magnetically attached to a common DUT layout unit 600, in accordance with embodiments of the present invention.

FIG. 7A illustrates a plurality of contact chuck assemblies 200 magnetically attached to a plurality of DLU heat sink units 610, in accordance with embodiments of the present invention. FIG. 7B illustrates a top isometric view of a plurality of contact chuck assemblies 200 magnetically attached to a common DUT layout unit 600, in accordance with embodiments of the present invention.

Figure 7C:
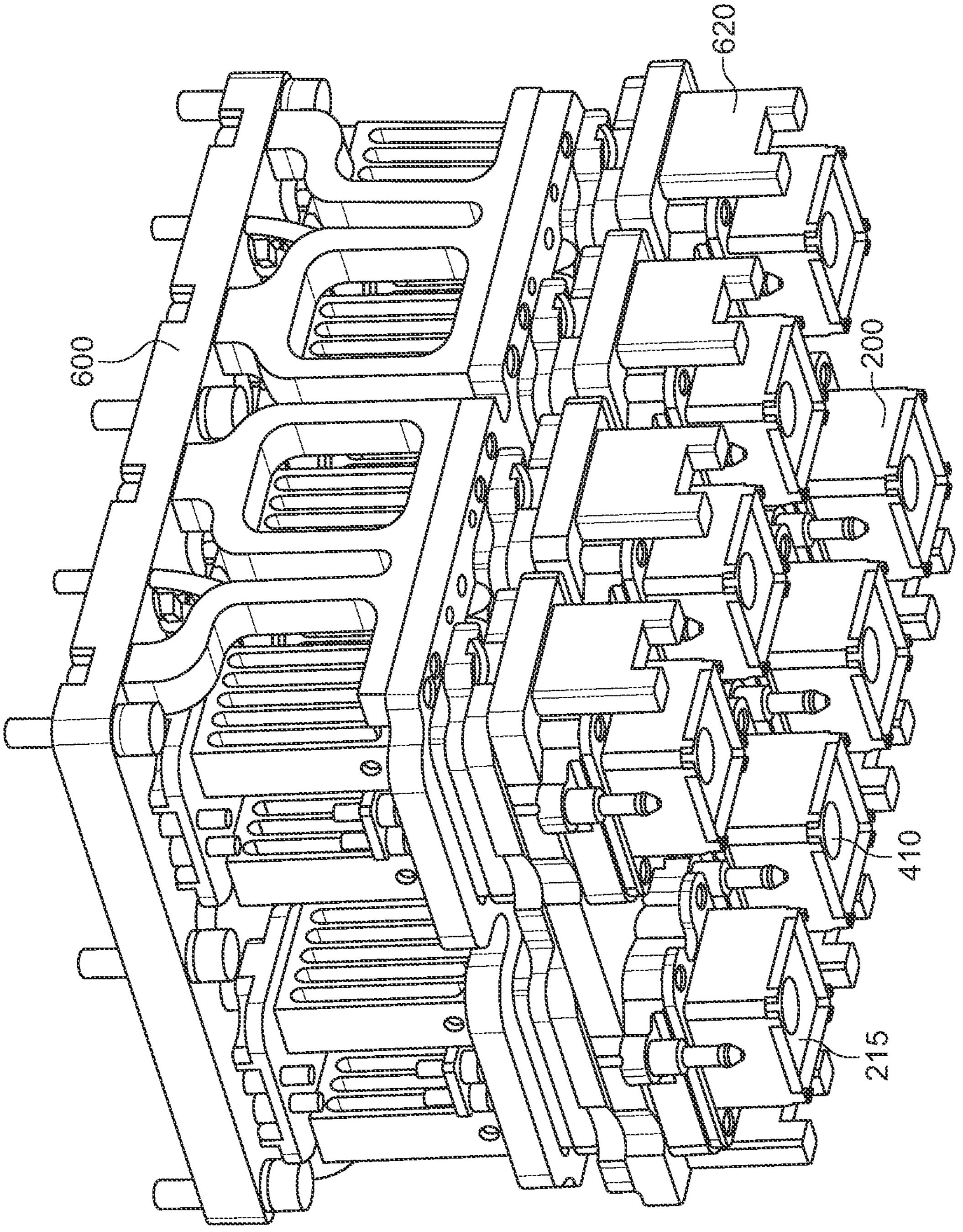
FIG. 7C illustrates a bottom isometric view of a plurality of contact chuck assemblies magnetically attached to a common DUT layout unit, in accordance with embodiments of the present invention.

FIG. 7C illustrates a bottom isometric view of a plurality of contact chuck assemblies 200 magnetically attached to a common DUT layout unit 600, in accordance with embodiments of the present invention. FIG. 7C also illustrates a portion of cylinder 410 within contact chuck assembly 200.

Figure 8:
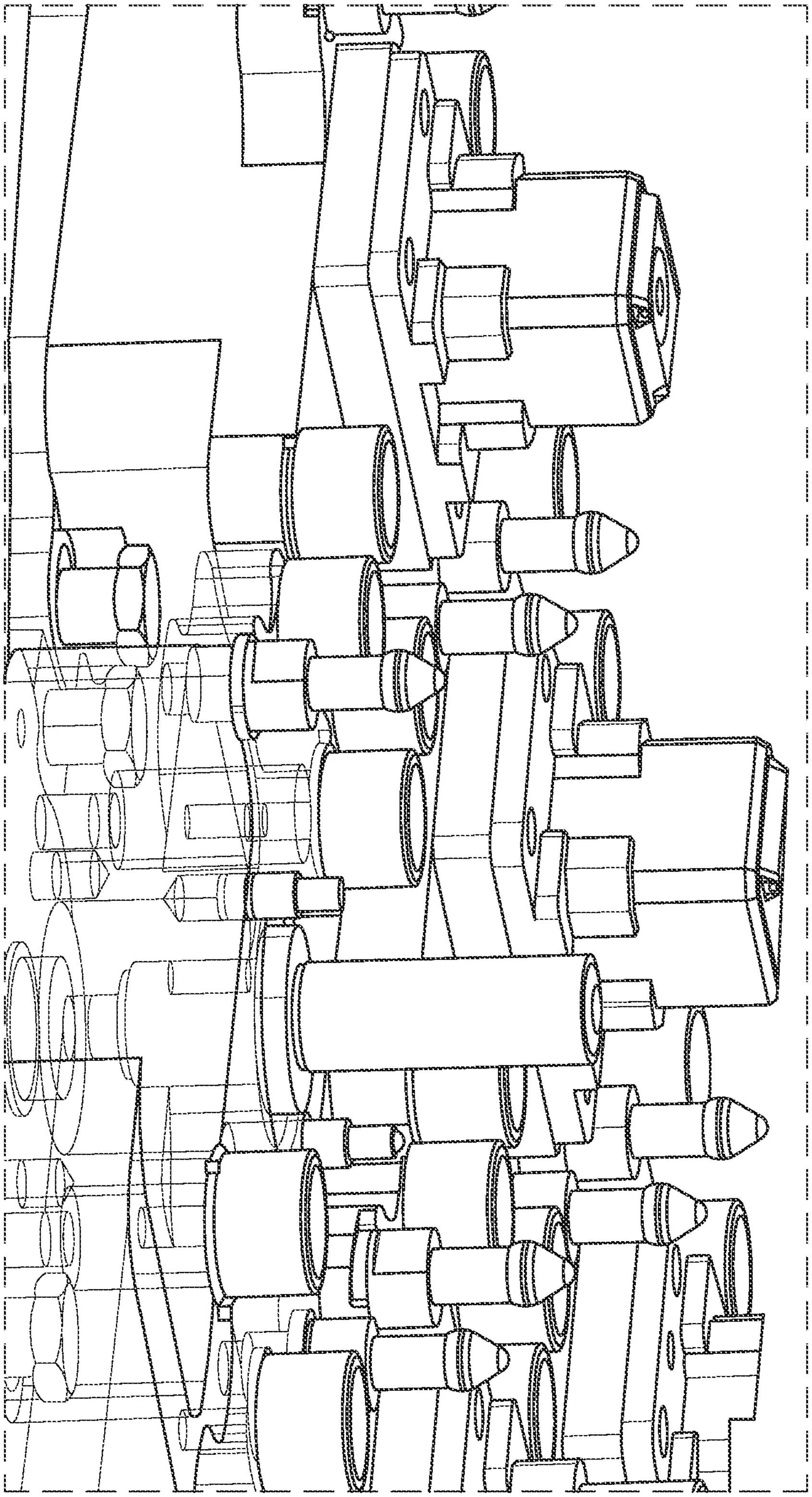
FIG. 8 illustrates a nozzle and a pneumatic piston within a contact chuck assembly, in accordance with embodiments of the present invention.

FIG. 8 illustrates a nozzle and a pneumatic piston within a contact chuck assembly, in accordance with embodiments of the present invention.

Embodiments in accordance with the present invention provide systems and methods for replaceable contact chuck test heads utilizing magnetic force coupling. Although the invention has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

Various embodiments of the invention are thus described. While the present invention has been described in particular embodiments, it should be appreciated that the invention should not be construed as limited by such embodiments, but rather construed according to the below claims.

I claim:

1. A contact chuck test head assembly comprising:

a device under test (DUT) interface unit configured to physically mate with a DUT;

a contact chuck base unit configured to magnetically retain the DUT interface unit, wherein the contact chuck base unit is configured to be magnetically retained by a handler device, wherein the handler device is configured to move DUTs within a test environment, and wherein the contact chuck test head assembly is configured to apply a force to the DUT in a test fixture during testing of the DUT; and a pneumatic coupler configured to retain the DUT during movement of the contact chuck test head assembly.

2. The contact chuck test head assembly of claim 1 wherein the contact chuck test head assembly is magnetically attached to a DUT layout unit.

3. The contact chuck test head assembly of claim 1 wherein the contact chuck test head assembly is magnetically attached to a DUT layout unit heat sink unit.

4. The contact chuck test head assembly of claim 1 further comprising a hardstop plate configured to limit downward travel of the contact chuck test head assembly.

5. The contact chuck test head assembly of claim 1 further comprising an alignment projection to align the contact chuck test head assembly with a test fixture.

6. The contact chuck test head assembly of claim 1 further configured to conduct heat energy away from said DUT during testing.

7. The contact chuck test head assembly of claim 1 further comprising alignment holes to accept protrusions from a DUT layout unit to align said contact chuck test head assembly with said DUT layout unit.

8. The contact chuck test head assembly of claim 1 further comprising fastening holes configured for coupling to a non-magnetic DUT layout unit.

9. The contact chuck test head assembly of claim 1 further comprising a channel to apply a vacuum configured to retain said DUT.

10. The contact chuck test head assembly of claim 9 wherein said channel is further configured to apply a gas pressure to eject said DUT.

11. A magnetic device under test layout unit (DLU) comprising:

a DLU heatsink;

a contact chuck configured to magnetically retain a device under test (DUT) interface unit configured to physically mate with a DUT, wherein the DUT interface unit enables the contact chuck to apply a force to the DUT in a test environment during testing of the DUT;

a contact chuck interface between the DLU heatsink and the contact chuck, wherein the contact chuck interface is configured to retain the contact chuck via magnetic force, and wherein the contact chuck interface is configured to be magnetically retained by a handler device that enables the contact chuck to move the DUT within the test environment; and a pneumatic coupler configured to retain the DUT during movement of the contact chuck.

12. The DLU of claim 11 further comprising a plurality of magnets for coupling to said contact chuck.

13. The DLU of claim 12 wherein said magnets comprise samarium cobalt.

14. The DLU of claim 11 wherein said DLU comprises magnetic material attracted to magnets of said contact chuck.

15. The DLU of claim 11 wherein said contact chuck interface comprises projections configured to align with holes of said contact chuck.

16. The DLU of claim 11 wherein said contact chuck interface is configured to couple thermal energy from said DUT to said DLU heatsink.

17. A method of testing an integrated circuit device under test (DUT), the method comprising:

magnetically coupling a contact chuck to a device under test layout unit (DLU);

magnetically coupling a handler device to the DLU;

picking, with the handler device, a DUT using the contact chuck while the contact chuck is magnetically coupled to the DLU and the DLU is magnetically coupled to the handler device, the contact chuck including a pneumatic coupler configured to retain the DUT during the picking;

placing the DUT into a test fixture, including applying force to the DUT via the contact chuck; and testing the DUT in the test fixture.

18. The method of claim 17 wherein said picking further comprises applying a vacuum to said DUT through said contact chuck.

19. A pick and place system comprising:

a handler device configured for a movement in a test environment;

a device under test layout unit (DLU) magnetically coupled to the handler device;

a first contact chuck configured for magnetic release from the DLU by manual decoupling;

a second contact chuck configured for magnetic attachment to the DLU by manual coupling;

the first contact chuck and the second contact chuck configured for mechanically attaching to the DLU;

the first contact chuck configured for mating with a first device under test (DUT), wherein the first contact chuck includes a first pneumatic coupler configured to retain the first DUT during the movement;

the second contact chuck configured for mating with a second DUT, wherein the second contact chuck includes a second pneumatic coupler configured to retain the second DUT during the movement; and the movement including moving the DLU, including the first contact chuck, the second contact chuck, the first DUT, and the second DUT, to a test fixture in the test environment, including applying force to the first DUT and the second DUT with respect to the test fixture.

* * * * *